(12) United States Patent
Sekiguchi et al.

(10) Patent No.: US 10,677,835 B2
(45) Date of Patent: Jun. 9, 2020

(54) EVALUATION METHOD FOR INSULATION PERFORMANCE OF INSULATOR

(71) Applicant: SUMITOMO ELECTRIC INDUSTRIES, LTD., Osaka-shi, Osaka (JP)

(72) Inventors: Yoitsu Sekiguchi, Osaka (JP); Tatsuo Takada, Tokyo (JP); Yasuhiro Tanaka, Tokyo (JP); Masumi Fukuma, Matsue (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 95 days.

(21) Appl. No.: 16/081,583

(22) PCT Filed: Mar. 2, 2017

(86) PCT No.: PCT/JP2017/008380
§ 371 (c)(1),
(2) Date: Aug. 31, 2018

(87) PCT Pub. No.: WO2017/150691
PCT Pub. Date: Sep. 8, 2017

(65) Prior Publication Data
US 2019/0120893 A1    Apr. 25, 2019

(30) Foreign Application Priority Data
Mar. 3, 2016    (JP) ................. 2016-041451

(51) Int. Cl.
*G01R 31/12*    (2020.01)
*G01R 31/50*    (2020.01)

(52) U.S. Cl.
CPC ......... *G01R 31/1272* (2013.01); *G01R 31/12* (2013.01); *G01R 31/50* (2020.01)

(58) Field of Classification Search
CPC ....... G01R 31/50; G01R 31/12; G01R 27/025
See application file for complete search history.

(56) References Cited

U.S. PATENT DOCUMENTS

| 2012/0306511 | A1* | 12/2012 | Li | G01R 31/1227 324/555 |
| 2013/0093457 | A1* | 4/2013 | Obata | G01R 31/343 324/765.01 |
| 2015/0015303 | A1* | 1/2015 | Sakurai | G01R 31/343 324/765.01 |

FOREIGN PATENT DOCUMENTS

| JP | S58-144762 A | 8/1983 |
| JP | S61-61069 A | 3/1986 |

(Continued)

OTHER PUBLICATIONS

Takada et al., "Deduction of Electric Charge Distribution in Polymer Film," The transactions of the Institute of Electrical Engineers of Japan, 1972, pp. 537-544, vol. 92-A, No. 12, including partial English translation.

(Continued)

*Primary Examiner* — Jermele M Hollington
*Assistant Examiner* — Alvaro E Fortich
(74) *Attorney, Agent, or Firm* — Faegre Drinker Biddle & Reath LLP

(57) ABSTRACT

An evaluation method for insulation performance includes: a step α of applying a DC voltage to a first insulator and measuring an integration value of a current flowing through the first insulator from a start of application of the DC voltage after a prescribed time period; a step β of applying a DC voltage to the second insulator on an applying condition that is identical to that in the step α and measuring an integration value of a current flowing through the second insulator from a start of application of the DC voltage after a prescribed time period; and a step γ of comparing (i) a first (Continued)

graph obtained in the step α and (ii) a second graph obtained in the step β, to evaluate a difference between insulation performances of the insulators.

13 Claims, 13 Drawing Sheets

(56) References Cited

FOREIGN PATENT DOCUMENTS

| JP | H02-161368 A | 6/1990 |
|---|---|---|
| JP | H11-166955 A | 6/1999 |
| JP | 2005-227079 A | 8/2005 |
| JP | 2011-242206 A | 12/2011 |
| JP | 2013-29450 A | 2/2013 |

OTHER PUBLICATIONS

JEC-TR-61004, "Calibration for Space Charge Distribution Measurement using Pulsed Electro-Acoustic Method" Technical Report of The Institute of Electrical Engineers of Japan, Japanese Electrotechnical Committee, Dec. 25, 2012, pp. 1-35, including partial English translation.

IEC TS 62758, "Calibration of Space Charge Measuring Equipment based on Pulsed Electro-Acoustic Measurement Principle", IEC Technical Specification, International Electrotechnical Commission, Sep. 18, 2012.

Du B X et al., Electrical Insulation and Dielectric Phenomena, 2009, CEIDP '09, IEEE Conference on, IEEE, Piscataway, NJ, USA, Oct. 18, 2009, pp. 303-306.

* cited by examiner

EVALUATION METHOD FOR INSULATION PERFORMANCE OF INSULATOR

TECHNICAL FIELD

The present invention relates to an evaluation method for insulation performance of an insulator.

The present application claims priority based on Japanese Patent Application No. 2016-041451 filed on Mar. 3, 2016, and incorporates the entire description in the Japanese application.

BACKGROUND ART

Conventionally, a method of deterioration diagnosis for an insulating layer in a power cable for alternating-current (AC) power transmission has been variously studied. For example, in PTD 1, a deterioration diagnosis for an insulating layer is carried out concurrently using the residual charge method and the loss current method, both of which are applied in a cable in service using an AC voltage.

On the other hand, a technique for estimating a change in insulation performance of an insulator is disclosed, for example, in NPD 1. In NPD 1, when a direct-current (DC) voltage is applied to an insulator, the amount of electric charge accumulated inside the insulator is estimated to evaluate the insulation performance of the insulator.

CITATION LIST

Patent Document

PTD 1: Japanese Patent Laying-Open No. 2013-029450

Non Patent Document

NPD 1: "Deduction of Electric Charge Distribution in Polymer Film" by Tatsuo TAKADA, Takao SAKAI, Yotsuo TORIYAMA, (The transactions of the Institute of Electrical Engineers of Japan, Vol. 92-A, No. 12, pages 537 to 544, 1972)

SUMMARY OF INVENTION

An evaluation method for insulation performance of an insulator according to one embodiment of the present invention includes: a step α of applying a DC voltage to a first insulator on a prescribed applying condition, and measuring an integration value of a current flowing through the first insulator from a start of application of the DC voltage until an elapse of a prescribed time period after an end of application of the DC voltage; a step β of applying a DC voltage to a second insulator on an applying condition that is identical to the applying condition in the step α, and measuring an integration value of a current flowing through the second insulator from a start of application of the DC voltage until an elapse of a prescribed time period after an end of application of the DC voltage; and a step γ of comparing (i) a first graph showing a relation between an elapsed time period and the integration value that are obtained in the step α and (ii) a second graph showing a relation between an elapsed time period and the integration value that are obtained in the step β, to evaluate a difference between insulation performance of the first insulator and insulation performance of the second insulator, the difference being caused by applying the DC voltage. Each of integration values is obtained by a current integrator including: a capacitor connected in series to a corresponding one of the first insulator and the second insulator; and a voltmeter configured to measure a voltage applied to the capacitor, the current integrator being configured to measure each or the integration values based on a measurement result of the voltmeter. The applying condition includes: a voltage raising operation for raising a voltage from 0 kV to a prescribed final attained voltage; a voltage holding operation for holding the final attained voltage for a fixed time period; a discharge operation for discharging the capacitor while stopping application of a voltage; and a grounding operation for grounding the capacitor.

DETAILED DESCRIPTION

Figure 1:
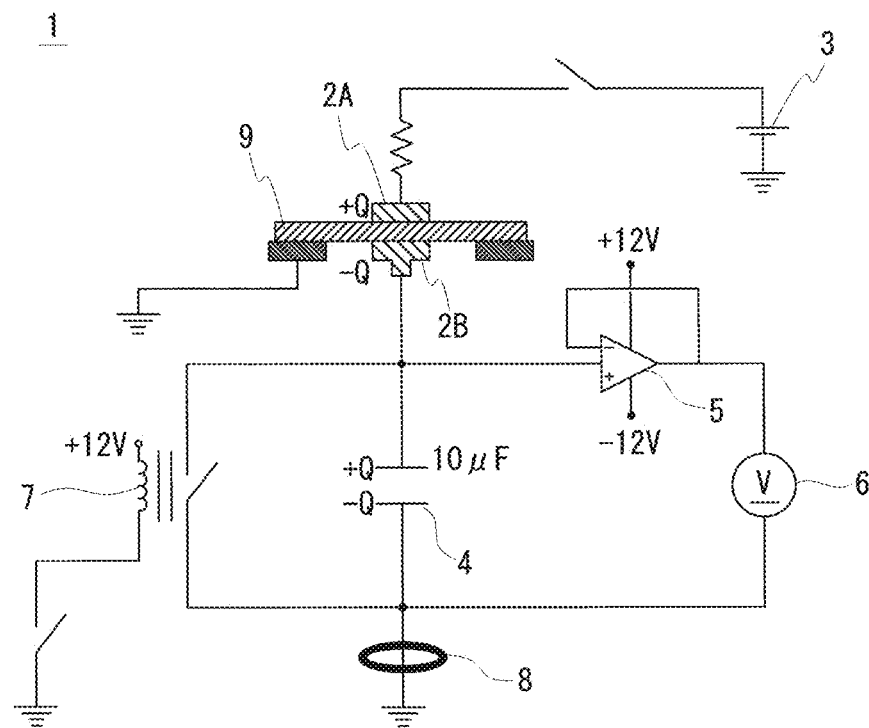
FIG. 1 is a schematic circuit diagram of a current integrator configured to apply a DC voltage to an insulating sample to measure an integration value of the current flowing through the sample over time.

[Problem to be Solved by the Present Disclosure]

In recent years, high-voltage DC power transmission has been studied, and it is considered that a method for diagnosing the state of an insulating layer (a layer formed of an insulator) included in a power cable is required. Furthermore, in consideration of the present circumstances in which it has been examined that not only a power cable but also various electrical devices are used at a direct current, it is considered that a method for diagnosing the state of an insulator at a DC voltage is required. However, there is currently no effective method for diagnosing the state of an insulator associated with application of a DC voltage.

On the inside of the insulator of the power cable or the electrical device used at a direct current, space charge is more likely to be accumulated at a DC voltage as compared with an AC voltage, so that distortion occurs in the internal electric field of an insulator. It is considered that, in the insulator to which a DC voltage is applied, insulation deterioration is facilitated by combined factors such as accumulation of space charge and oxidation by temperature rise. However, there is no law-like regularity in the manner of accumulation of such space charge, and thus, the detailed mechanism of deterioration of an insulator has not been clarified. For example, as a power cable used for DC power transmission, there are an oil-impregnated insulation cable including an insulating layer (an insulator) obtained by winding oil-impregnated paper around a conductor, and a solid insulation cable obtained by covering a conductor with a solid insulator such as cross-linked polyethylene, which are different in the manner of accumulation of space charge depending on insulators, and also different in the manner of deterioration of each insulator. In view of the above-described circumstances, as a technique leading to the state diagnosis for an insulator in a power cable for DC power transmission and an electrical device used at a direct current, it has been required to develop a method for monitoring changes in insulation performance of an insulator over time that are caused by application of a DC voltage so as to evaluate a difference in insulation performance of the insulator that is caused by application of a DC voltage.

An object of the present disclosure is to provide an evaluation method for insulation performance of an insulator, by which a difference in insulation performance of an insulator that is caused by application of a DC voltage can be evaluated.

Generally, when a DC voltage is applied to an insulator sandwiched between electrodes, a weak current flows through the insulator. The current mainly includes a charge current, a space charge accumulation current, a leakage current, and a partial discharge current.

A charge current (which may also be referred to as a displacement current): the insulator sandwiched between electrodes has exactly the same configuration as a capacitor. Accordingly, by starting application of a DC voltage, charge accumulation accompanied with a change in dipole alignment occurs. The current that flows in that situation is a charge current, which changes in accordance with the relative dielectric constant of the insulator. This charge current is a current that flows only for a prescribed time period from the start of application of a DC voltage.

A space charge accumulation current (which may also be referred to as an absorption current): a current generated in an insulator in accordance with generation and movement of space charge when a DC voltage is applied to the insulator. This space charge accumulation current flows only for a prescribed time period from the start of application of a DC voltage, like a charge current.

A leakage current: an extremely weak current flows even through an insulator. Namely, the current that flows in accordance with the electric conductivity of the insulator is a leakage current. The leakage current flows for a time period during which a DC voltage is applied.

A partial discharge current: when there is a discharge gap inside the insulator, partial discharge (corona) occurs in the discharge gap. The current that instantaneously flows at that time is a partial discharge current.

Each current that flows through the insulator as described in the above paragraph is extremely weak. Accordingly, only by measuring an instantaneous current value, it cannot be possible to sufficiently recognize temporal changes in physical quantities of the insulator that are related to the insulation performance of the insulator (four types including: a relative dielectric constant, space charge accumulation, electric conductivity, and existence of a discharge gap). Thus, the present inventors have attempted to clarify the behavior of each current that flows through the insulator by applying a DC voltage to an insulator to exhaustively measure the integration value of the current flowing through the insulator from the start of application of a DC voltage until an elapse of a prescribed time period after the end of application of a DC voltage. The integration value of the current can be calculated as follows. Specifically, a sufficiently large capacitor with respect to the capacitance of the insulator is connected in series to the insulator, and then, the voltage to be applied to the capacitor is measured, so that the integration value of the current can be calculated. By comparing the behaviors of the current over time based on such measurement of the integration value, the present inventors have conceived of a method of evaluating the difference in insulation performance of the insulator. In the following, an evaluation method for insulation performance of an insulator according to an embodiment will be specified.

[Description Regarding the Present Disclosure]

Details of the embodiment of the invention of the present application will be first described.

<1> An evaluation method for insulation performance of an insulator according to an embodiment includes: a step α of applying a DC voltage to a first insulator on a prescribed applying condition, and measuring an integration value of a current that flows through the first insulator from a start of application of the DC voltage until an elapse of a prescribed time period after an end of application of the DC voltage; a step β of applying a DC voltage to a second insulator on an applying condition that is identical to the applying condition in the step α, and measuring an integration value of a current that flows through the second insulator from a start of application of the DC voltage until an elapse of a prescribed time period after an end of application of the DC voltage; and a step γ of comparing (i) a first graph showing a relation between an elapsed time period and the integration value that are obtained in the step α and (ii) a second graph showing a relation between an elapsed time period and the integration value that are obtained in the step β, to evaluate a difference between insulation performance of the first insulator and insulation performance of the second insulator, the difference being caused by applying the DC voltage.

Each of integration values is obtained by a current integrator including: a capacitor connected in series to a corresponding one of the first insulator and the second insulator; and a voltmeter configured to measure a voltage applied to the capacitor, the current integrator being configured to measure each of the integration values based on a measurement result of the voltmeter. The applying condition includes: a voltage raising operation for raising a voltage from 0 kV to a prescribed final attained voltage; a voltage holding operation for holding the final attained voltage for a fixed time period; a discharge operation for discharging the capacitor while stopping application of a voltage; and a grounding operation for grounding the capacitor.

In the evaluation method for insulation performance of an insulator makes utilization of the feature that the time integration value of the current corresponds to electric charge. When an integration capacitor is connected in series to an insulator, to which a DC voltage is applied, the same amount of electric charge as that accumulated in the insulator is accumulated also in the integration capacitor. The time integration value of the current is measured by this method. Accordingly, by setting the measuring time period to be relatively long, even a micro current can be sufficiently sensed.

In the evaluation method for insulation performance of an insulator, the voltage applied to an integration capacitor is measured during a time period from a start of voltage application until grounding. Specifically, the integration value of every current flowing through an insulator during a time period from a start of voltage application through a discharge operation until grounding is exhaustively measured. The voltage application procedure including the above-described operations imitates the actual manner of using a DC device. Accordingly, based on the information obtained in the above voltage application procedure, the insulation performance of the insulator can be evaluated in accordance with the actual manner of use.

During the voltage raising operation in the voltage application procedure, the voltage is still low, and the influence of the charge current upon the integration value is predominant. Also, in the early stage of the voltage holding operation, the influence of the space charge accumulation current upon the integration value is high. In the latter stage of the voltage holding operation, the influence of the leakage current upon the integration value is high. Based on the information obtained in each of the operations, by checking the integration value of the current that flows through the insulator in accordance with application of a DC voltage, the details of the change in each current that flows through the insulator can be obtained. Then, based on the change in current, the change in insulation performance of the insulator can be obtained. Thus, by comparing the data of the first insulator obtained in step $\alpha$ and the data of the second insulator obtained in step $\beta$, the difference in insulation performance between the first and second insulators can be evaluated.

<2> As one aspect of the evaluation method for insulation performance of an insulator according to an embodiment, there may be an embodiment in which the second insulator is provided as the first insulator that is changed in insulation performance, and the step $\alpha$ and the step $\beta$ are identical in measurement environment condition.

The first insulator that is changed in insulation performance means the first insulator that is obtained after the first insulator measured in step $\alpha$ is left in an environment, applied with thermal hysteresis, or applied with a prescribed voltage. In other words, the first insulator is the second insulator before undergoing a state change. Namely, in step $\beta$ of the above-described configuration, after an elapse of a prescribed time period since step $\alpha$ is performed, the first insulator used in step $\alpha$ is again measured in the same measurement environment as that in step $\alpha$. In step $\gamma$, by comparing the result obtained in step $\alpha$ and the result obtained in step $\beta$, the temporal change in insulation performance of the insulator can be evaluated. Also, by comparing the result obtained in step $\alpha$ and the result obtained in step $\beta$, the mechanism of the change in insulation performance of the insulator may be able to be clarified.

<3> As one aspect of the evaluation method for insulation performance of an insulator according to an embodiment, there may be an embodiment in which the second insulator is made of a material different from a material of the first insulator, and the step $\alpha$ and the step $\beta$ are identical in measurement environment condition.

According to the above-described evaluation method, the optimal material of the insulator in accordance with a use purpose can be specified. For example, in the use situation in which not only insulation performance but also mechanical strength is required, when there are two materials that are approximately identical in mechanical strength, it becomes possible to check, by using the above-described evaluation method, as to which material is suitable as an insulator at a prescribed DC voltage.

<4> As one aspect of the evaluation method for insulation performance of an insulator according to an embodiment, there may be an embodiment in which the second insulator is made of a material identical to a material of the first insulator, and the step $\alpha$ and the step $\beta$ are different in measurement environment condition.

Examples of the measurement environment may include a temperature, humidity, an atmosphere, pressure, and the like. For example, when the measurement is conducted at a room temperature in step $\alpha$ and the measurement is conducted at 100° C. in step $\beta$, it can be examined whether the insulator is preferable or not to be used in an environment where the temperature changes from a room temperature to 100° C.

<5> As one aspect of the evaluation method for insulation performance of an insulator according to an embodiment, there may be an embodiment including: a step $\delta$ of applying a DC voltage to the first insulator on an applying condition that is different only in the final attained voltage from the applying condition in the step $\alpha$, and measuring an integration value of a current that flows through the first insulator from a start of application of the DC voltage until an elapse of a prescribed time period after an end of application of the DC voltage; and a step s of applying a DC voltage to the second insulator on an applying condition that is identical to the applying condition in the step $\delta$, and measuring an integration value of a current that flows through the second insulator from a start of application of the DC voltage until an elapse of a prescribed time period after an end of application of the DC voltage. The step $\gamma$ includes evaluating a difference between the insulation performance of the first insulator and the insulation performance of the second insulator, together with a measurement result obtained in the step $\gamma$ and a measurement result obtained in the step $\varepsilon$.

According to the above-described measuring method, it becomes possible not only to compare the result obtained in step $\alpha$ and the result obtained in step $\beta$ at the same voltage, but also to obtain the information about the insulation performance of the first insulator and the information about the insulation performance of the second insulator at different voltages. As a result, the insulation performance of each insulator at a DC voltage can be more specifically evaluated.

<6> As one aspect of the evaluation method for insulation performance of an insulator according to an embodiment, there may be an embodiment in which each insulation performance is a relative dielectric constant of a corresponding one of the first insulator and the second insulator. The relative dielectric constant corresponds to a portion that exists in the first graph or the second graph and that is related to a charge current accumulated in each of the first insulator and the second insulator. The relative dielectric constant is calculated from each of the integration values obtained in a portion from a start of application of the DC voltage until a prescribed time period.

As described above, the charge current is a current that flows in the case where an insulator and an electrode for applying a DC voltage to the insulator are regarded as a capacitor. Also, the charge current is a current related to the relative dielectric constant of the insulator. The charge current flows for a short time period from a start of application of a DC voltage. Accordingly, by checking the integration value of the current in the early stage at the start of application of a DC voltage in the graph, the magnitude of the charge current, that is, the relative dielectric constant of the insulator, can be recognized and evaluated. For example, when the second insulator is the first insulator that is changed in insulation performance, the temporal change in relative dielectric constant of the insulator can be recognized by comparing the integration value in step α and the integration value in step β.

<7> As one aspect of the evaluation method for insulation performance of an insulator according to an embodiment, there may be an embodiment in which each insulation performance is electric conductivity of a corresponding one of the first insulator and the second insulator. The electric conductivity corresponds to a portion that exists in the first graph or the second graph and that is related to a leakage current flowing through each of the first insulator and the second insulator. Also, the electric conductivity is calculated from an inclination of each of the integration values obtained after an elapse of a prescribed time period since a start of application of the DC voltage.

As described above, the leakage current is a current related to the electric conductivity of the insulator and flows during application of a DC voltage to the insulator. Thus, in order to obtain the magnitude of the leakage current, it is preferable to check the inclination of the integration value of the current after an elapse of a prescribed time period since a start of application of a DC voltage, that is, in a time zone considered that there is almost no influence of a charge current or a space charge accumulation current that flows for a short time period after a start of application of a DC voltage. By checking the inclination of the integration value of the current in the time zone in which there is almost no influence of a charge current or a space charge accumulation current, the magnitude of the leakage current, that is, the electric conductivity of the insulator, can be recognized and evaluated. For example, when the second insulator is the first insulator that is changed in insulation performance, by comparing the inclination of the integration value of the current in the time zone in step α and the inclination of the integration value of the current in the time zone in step β, the temporal change in electric conductivity of the insulator can be recognized. In this case, the reciprocal of the electric conductivity of the insulator is the volume resistivity of the insulator. When the electric conductivity is obtained, the volume resistivity can also be obtained by calculation.

<8> As one aspect of the evaluation method for insulation performance of an insulator according to an embodiment, there may be an embodiment in which each insulation performance is a state of existence of a discharge gap inside a corresponding one of the first insulator and the second insulator, and the state of existence of the discharge gap is obtained by specifying a portion that exists in the first graph or the second graph and that is related to a partial discharge current flowing through each of the first insulator and the second insulator.

As described above, the partial discharge current is a current that is generated when partial discharge occurs in the discharge gap inside the insulator, and that flows randomly during application of a DC voltage to the insulator. Thus, in order to find occurrence of a partial discharge current, it is preferable to check a sudden increase in integration value of the current (a step-wise increase in integration value). By checking the magnitude and the frequency of the partial discharge current, the state of existence (the amount and the magnitude) of the discharge gap inside the insulator can be recognized and evaluated. For example, when the second insulator is the first insulator that is changed in insulation performance, by comparing the occurrence frequency and the magnitude of the partial discharge current in step α with the occurrence frequency and the magnitude of the partial discharge current in step β, the state of formation of the discharge gap in the insulator over time can be recognized.

<9> As one aspect of the evaluation method for insulation performance of an insulator according to an embodiment for specifying a portion existing in the graph and related to a partial discharge current, there may be an embodiment in which each of the step c and the step β includes sensing a timing of occurrence of partial discharge by a sensor configured to sense a high frequency pulse generated during partial discharge, to specify the partial discharge current in each of the first graph and the second graph.

During partial discharge, a high frequency current flows through the insulator. By sensing the pulse of the high frequency current by the sensor to recognize the timing of occurrence of partial discharge, it becomes possible to reliably specify the position at which partial discharge occurs in the graph of the integration value of the current. As a result, the existence of the discharge gap formed inside the insulator can be more accurately estimated.

<10> As one aspect of the evaluation method for insulation performance of an insulator according to an embodiment, there may be an embodiment in which each insulation performance is an accumulation behavior of space charge in a corresponding one of the first insulator and the second insulator, and an influence of the accumulation behavior of the space charge is calculated by comparing $Q_A/Q_0$ in the first graph or the second graph. In this case, $Q_0$ is the integration value at time $T_0$ at which a charge current accumulated in each of the first insulator and the second insulator after an elapse of a prescribed time period since a start of application of the DC voltage decreases to a negligible level, and $Q_A$ is the integration value at time $T_A$ after an elapse of a prescribed time period since the time $T_0$.

In the graph showing the integration value of the current, in the course of process from the time zone in which the charge current flowing for a short time period after a start of application of a DC voltage has a significant influence to the time zone in which the leakage current flowing in the equilibrium state has a significant influence, space charge accumulates inside the insulator while moving around the insulator for several minutes to several dozen minutes. In this space charge accumulation, there is a repetition of processes of generation, movement, or capturing and accumulation of electric charge. The time period of this repetition is so long as several minutes or more. Since space charge has potential energy of a chemical reaction, it facilitates complex insulation deterioration resulting from the existence of oxygen and moisture together with the influence of temperature. Accordingly, it is an important factor to conduct a measurement in accordance with application of a DC voltage for evaluating deterioration in insulation performance of the insulator.

As described above, since space charge accumulation is an important factor for evaluating the deterioration in insulation performance of the insulator, it is also extremely important to recognize its behavior. However, in the time zone in which a space charge accumulation current flows, the charge current has already decreased to a negligible level but is in coexistence with the leakage current. Thus, it becomes important to separate the space charge accumulation current and the leakage current from each other. The method for such separation can be conceivable as follows. Specifically, an integration value $Q_0$ at the time when the section of the charge current in the early stage of voltage application is ended and switched to the section in which a space charge accumulation current and a leakage current may exist (time $T_0$) is calculated; and an integration value $Q_A$ at time $T_A$ after an elapse of a prescribed time period since time $T_0$ is calculated. Then, by checking a ratio $Q_A/Q_0$, the influence of space charge can be recognized. For example, when the influence of the space charge accumulation current is small and almost no leakage current flows, $Q_A/Q_0$ is approximately equal to 1. On the other hand, when the influence of the space charge accumulation current becomes large, $Q_A/Q_0$ shows a value of 1.1 to 1.5. Furthermore, when a leakage current is a main component, $Q_A/Q_0$ becomes a value exceeding 1.5. By graphically plotting $Q_A/Q_0$ with respect to the applied voltage, the voltage influenced by space charge and the voltage composed mainly of a leakage current can be recognized and evaluated.

<11> As one aspect of the evaluation method for insulation performance of an insulator according to an embodiment for obtaining a space charge accumulation current, there may be an embodiment in which each of the step α and the step β includes sensing the accumulation behavior of the space charge by a pulsed electro-acoustic (PEA) method, to specify the accumulation behavior of the space charge in each of the first graph and the second graph.

The PEA method is a measuring method by which the amount and the location information of the space charge in the insulator applied with a DC voltage can be obtained. Accordingly, it is considered that the change in insulation performance of the insulator, for example, local deterioration in insulation performance and the like can be specifically recognized by complexly analyzing the information about the space charge accumulation current obtained from the graph of the integration value of the current and the information obtained by the PEA method.

<12> As one aspect of the evaluation method for insulation performance of an insulator according to an embodiment, there may be an embodiment in which the current integrator is disposed on a ground side of each of the first insulator and the second insulator to measure a corresponding one of the integration values.

The above-described configuration is suitable when a device for sensing a high frequency pulse generated when a partial discharge current flows is provided together with a current integrator.

<13> As one aspect of the evaluation method for insulation performance of an insulator according to an embodiment, there may be an embodiment in which the current integrator is disposed on a high voltage side of each of the first insulator and the second insulator to measure a corresponding one of the integration values.

The above-described configuration is suitable when a device for measuring space charge in an insulator is provided together with a current integrator.

Description of Embodiments

In the following, embodiments of an evaluation method for insulation performance of an insulator according to an embodiment will be described. It is to be noted that the invention of the present application is not limited to the configuration shown in each embodiment, but defined by the terms of the claims, and is intended to include any modifications within the meaning and scope equivalent to the terms of the claims.

First Embodiment

In the first embodiment, a current integrator 1 shown in FIG. 1 is used to measure the integration value of the current flowing through an insulator 9 in accordance with application of a DC voltage, to evaluate the change in insulation performance of insulator 9. Insulator 9 used for measurement is obtained by stacking two sheets of kraft paper that is impregnated with polybutene and that has a thickness of 0.1 mm.

The configuration of current integrator 1 in FIG. 1 will be hereinafter simply described. Current integrator 1 includes electrodes 2A and 2B sandwiching insulator 9, a DC power supply 3, a capacitor 4, an amplifier 5, a voltmeter 6, a relay 7, and a high frequency current transformer 8.

Electrode 2A attached to one surface side of insulator 9 is an electrode on the high electric potential side, which is connected to DC power supply 3 through a resistance and a switch. On the other hand, electrode 2B is an electrode on the low electric potential side, which is attached to the surface of insulator 9 on the opposite side of electrode 2A. Electrodes 2A and 2B each are a circle electrode having a diameter of 28 mm. The distance between electrodes 2A and 2B corresponds to the thickness of insulator 9, that is, 0.2 mm.

In capacitor 4, the electric charge that flows through insulator 9 is accumulated. The accumulated electric charge is amplified by amplifier 5 and measured over time by voltmeter 6, so that the integration value of the current having flown through insulator 9 can be obtained. The integration value of the current can be obtained by measuring the voltage of capacitor 4 because the relation Q=CV is satisfied. In this case, C (capacitance of the capacitor) is already known (10 µF in the present example). Thus, when a voltage (V) of voltmeter 6 is obtained, the amount of electric charge (the integration value of the current) can be calculated.

In addition, relay 7 serves to allow the electric charge accumulated in capacitor 4 to leak to a ground for clearing the measurement result. Furthermore, high frequency current transformer 8 functions as a sensor for sensing the high frequency pulse generated when partial discharge occurs in insulator 9. High frequency current transformer 8 is connected to an oscilloscope (not shown), and can sense the timing of occurrence of a high frequency pulse current.

The above-described current integrator 1 is used to apply a DC voltage on a prescribed applying condition. The prescribed applying condition includes: a condition about the voltage rising rate (v/sec) at which a DC voltage is applied; a condition about the level at which the final DC voltage (applied voltage) is set; a condition about the time period during which the voltage is applied; and a condition about the time period elapsing from after stopping voltage application until grounding.

In the present example, a DC voltage was applied on the following three applying conditions. Even after the switch of current integrator 1 was turned off to end application of the DC voltage, integration value Q was measured until grounding.

(1) Voltage rising rate; 133 V/sec, final attained voltage; 2 kV, applying time period; 600 seconds after reaching 2 kV, holding time period after stopping voltage application; 180 seconds.

(2) Voltage rising rate; 133 V/sec, final attained voltage; 5 kV, applying time period; 600 seconds after reaching 5 kV, holding time period after stopping voltage application; 180 seconds.

(3) Voltage rising rate; 133 V/sec, final attained voltage; 8 kV, applying time period; 600 seconds after reaching 8 kV, and holding time period after stopping voltage application; 180 seconds.

Figure 2:
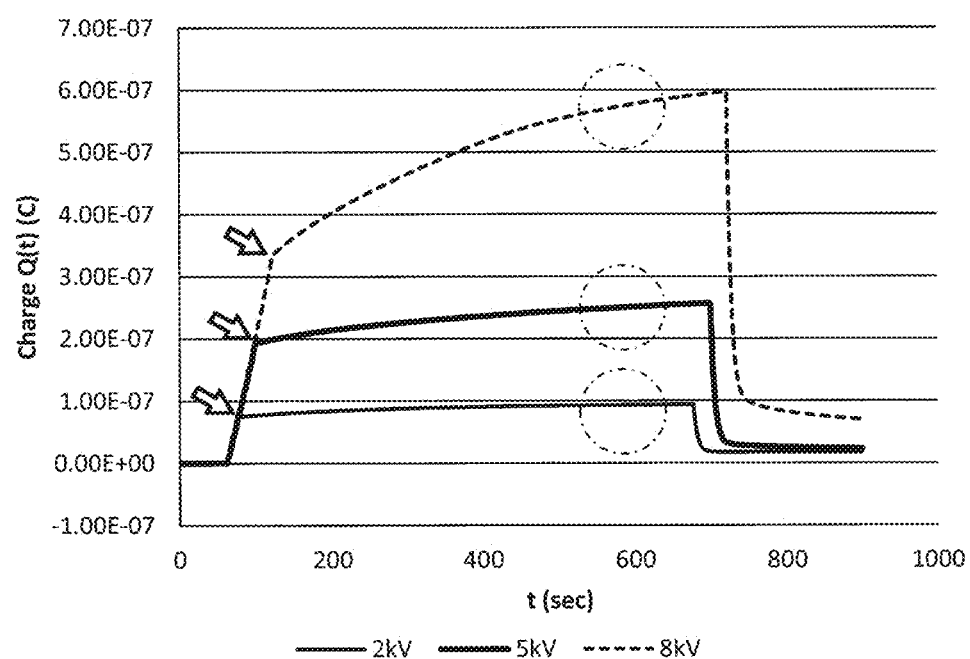
FIG. 2 is a graph showing the current integration measured in the state where the insulating sample is placed in oil.

FIG. 2 shows a graph obtained by graphically plotting integration value Q of the current at the time when a DC voltage is applied on the above-described three applying conditions. In the graph, the horizontal axis shows time t (sec) and the vertical axis shows an integration value Q of a current (coulomb). In FIG. 2, the measurement results of integration value Q of the current on the applying conditions in the above-described (1), (2), and (3) are shown by a thin solid line, a bold solid line and a dotted line, respectively. The graph shows the result obtained by starting voltage application after 60 seconds after the start of measurement of the current integration, raising the voltage to a final attained voltage at a prescribed voltage rising rate, and then, holding the final attained voltage for 600 seconds, and stopping voltage application and further holding the voltage for 180 seconds, and finally, short-circuiting and grounding relay 7 in FIG. 1. The voltage rising rate, the final attained voltage, the voltage holding time period, and the holding time period after stopping voltage application can be selected as appropriate in accordance with the details of the examination to be executed. Furthermore, it is considered that the behavior of the change in integration value during a time period from when voltage application is stopped until when the insulator and the current integrator are grounded is also important for analyzing the change in insulation performance of the insulator. Thus, the integration values are measured exhaustively from voltage rising to grounding. In this case, the integration value of the current was measured in the state where insulator 9 was immersed in insulating oil. In this way, occurrence of partial discharge can be suppressed, so that the measurement results can be less influenced by the partial discharge current.

As shown in FIG. 2, when voltage application is started 60 seconds after the start of measurement, integration value Q suddenly starts to increase. Such a sudden increase in integration value Q corresponds to a charge current that flows when insulator 9 and electrodes 2A and 2B are regarded as a capacitor. The relation of $Q=C_r V_{dc}$ ($C_r$; capacitance of the capacitor, Vdc; voltage of DC power supply 3) is satisfied, in which $C_r=\varepsilon_0 \times \varepsilon_r \times S/a$ ($\varepsilon_0$; dielectric constant of vacuum, $\varepsilon_r$; relative dielectric constant of capacitor, S; area of electrodes 2A and 2B, a; distance between electrodes 2A and 2B). Since only relative dielectric constant $\varepsilon_r$ of the capacitor (that is, the relative dielectric constant of insulator 9) is unknown in this case, $\varepsilon_r$ can be obtained by calculation. When the relative dielectric constant of insulator 9 increases, insulator 9 is more likely to undergo dielectric polarization by application of a DC voltage. Thus, it can be considered that the insulation performance of insulator 9 deteriorates.

Further referring to FIG. 2, after a sudden increase of integration value Q, integration value Q increases in a gradual and slow manner. This is because almost no charge current flows at this time, thereby leading to the state where a space charge accumulation current and a leakage current exclusively flow through insulator 9. In this case, a nonlinear inflection point is formed in the graph. Accordingly, it can be readily recognized by observation of the graph that the state where a charge current flows through insulator 9 has been changed to the state where a space charge accumulation current and a leakage current flow through insulator 9.

Specifically, in the time zone in which the influence of the space charge accumulation current is negligible (the time zone surrounded by an alternate long and short dash line in FIG. 2), which is included in the time zone in which the space charge accumulation current and the leakage current flow (the time zone after the inflection point shown by an outlined arrow in FIG. 2), the electric conductivity of insulator 9 can be obtained from the inclination of integration value Q of the current. The electric conductivity of insulator 9 can be obtained by $(1/S) \times (dQ/dt) \times (a/V_{dc})$. In this case, S, a, and $V_{dc}$ in this expression are as already described above, and dQ/dt shows the inclination of integration value Q. An increase in electric conductivity can be regarded as a decrease in insulation performance of insulator 9.

The influence of accumulation of space charge is calculated from the integration value of the current in the time zone in which a space charge accumulation current is dominant, which is included in the time zone in which a leakage current and a space charge accumulation current flow. Specifically, integration value $Q_0$ at the time when the charge current decreases to a negligible level (time $T_0$) (the integration value of the current at the inflection point shown by an outlined arrow in each graph in FIG. 2) is calculated, and integration value $Q_A$ at time $T_A$ after an elapse of a prescribed time period from the measurement point of $Q_0$ is calculated. Then, based on the value of the ratio $Q_A/Q_0$, the degree of accumulation of space charge can be estimated. For example, when no leakage current flows and when there is no space charge accumulation, $Q_A/Q_0$ becomes approximately 1. When the influence of the space charge accumulation current is high, $Q_A/Q_0$ is increased to approximately 1.1 to 1.5. Furthermore, when the applied voltage is high and the leakage current is dominant, $Q_A/Q_0$ suddenly increases over 1.5. However, such an evaluation needs to be performed within the range of $\Delta Q < Q_A$.

Then, integration value $Q_0$ in FIG. 2 and an integration value $Q_{300}$ after an elapse of 300 seconds from the measurement point of integration value $Q_0$ are extracted to calculate the ratio $Q_{300}/Q_0$. The result thereof is shown in Table 1, in which $Q_{300}/Q_0$ is 1.20 at the applied voltage of 2 kV, and $Q_{300}/Q_0$ is 1.57 at the applied voltage of 8 kV. It is considered that this shows that the space charge accumulation current is dominant during application of a low voltage of 2 kV, but the leakage current is dominant during application of a high voltage of 8 kV. In this way, by comparing $Q_A/Q_0$ calculated on one day ("A" day) with $Q_4/Q_0$ calculated on another day ("B" day), the change in space charge accumulation can be obtained.

TABLE 1

| Applied Voltage | Actual Measured Value of Q (coulomb) | | Ratio |
| --- | --- | --- | --- |
| | $Q_0$ | $Q_{300}$ | $Q_{300}/Q_0$ |
| 2 kV | $7.5 \times 10^{-8}$ | $9.0 \times 10^{-8}$ | 1.20 |
| 8 kV | $3.4 \times 10^{-7}$ | $5.3 \times 10^{-7}$ | 1.57 |

Figure 3:
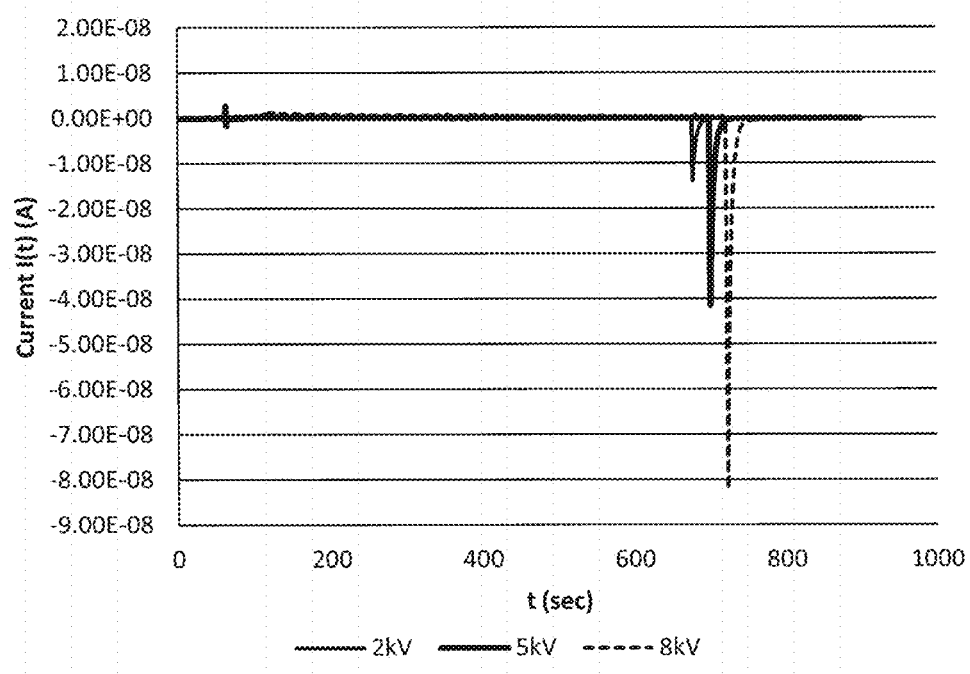
FIG. 3 is a graph showing the current value measured in the state where the insulating sample is placed in oil.

FIG. 3 shows the measurement results of the current value at the time when a DC voltage is applied on the above-described applying conditions (1) to (3). In FIG. 3, the horizontal axis shows a time period (sec) from the start of application of a DC voltage and the vertical axis shows a current value. As shown in FIG. 3, since the current value was extremely weak, it was difficult to recognize a change in value of the current flowing through insulator 9, with the result that the insulation performance of insulator 9 could not be evaluated. It is to be noted that a large negative current value was measured before and after 700 seconds in FIG. 3 because, due to the end of application of the DC voltage, the electric charge equivalent to the capacitance as a capacitor accumulated in insulator 9 was emitted at once as a discharge current.

Figure 4:
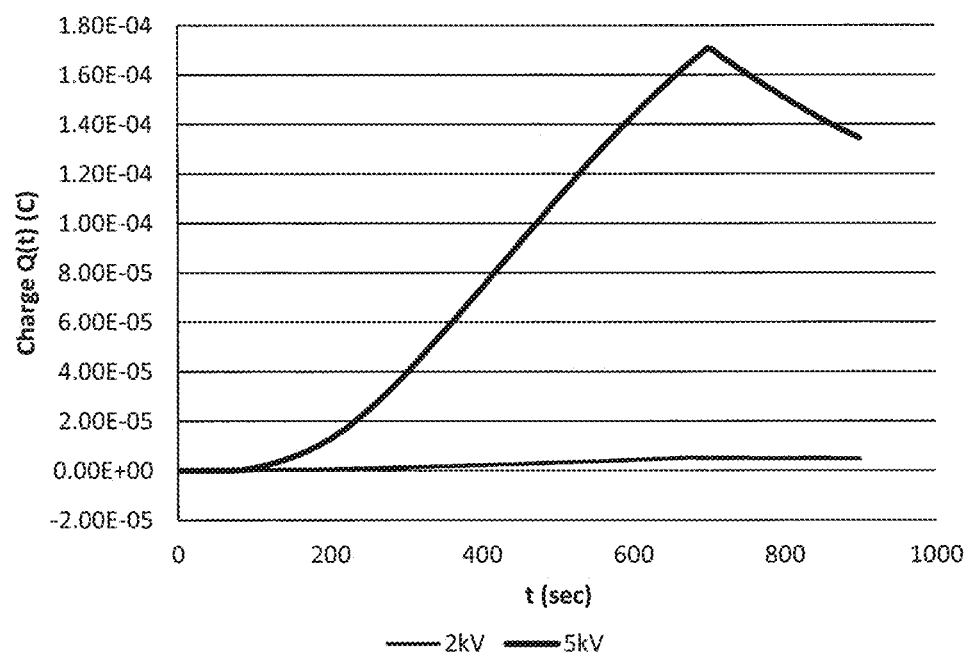
FIG. 4 is a graph showing the integration value of the current measured in the state where the insulating sample left for two months is placed in oil.

As having been described with reference to FIG. 2, the change in insulation performance of insulator 9 can be evaluated by analyzing each portion of integration value Q of the current in the graph. Specifically, by comparing the first graph of integration value Q of the current measured on one day ("A" day) and the second graph of integration value Q of the current measured on another day ("B" day), the temporal change in relative dielectric constant $\varepsilon_r$ and the temporal change in electric conductivity that are observed in insulator 9 can be recognized. For reference purposes, FIG. 4 shows the measurement results of insulator 9 that has been left for two months in atmospheric air and caused to absorb moisture. The applying condition of the DC voltage during the measurement was the same as the applying condition of 2 kV and the applying condition of 5 kV in FIG. 2.

As shown in FIG. 4, the second graph of integration value Q of the current is greatly different from the first graph in FIG. 2. Thus, it turned out that the state change of insulator 9 was remarkable. In the example in FIG. 4, since insulator 9 was left in the air, the state change in insulator 9 was significant. However, it is considered that the change in insulation performance of insulator 9 can be specifically tracked by improving the method of storing insulator 9 or by shortening the measuring span. In addition, the first graph and the second graph to be compared may be obtained at different times on the same day (for example, 9:00 a.m. and 6:00 p.m., and the like). Furthermore, the first graph and the second graph may be obtained before and after an influence is exerted by voltage application or heat application. Then, the change in insulation performance of the insulator caused by voltage application or heat application may be checked.

Second Embodiment

Figure 5:
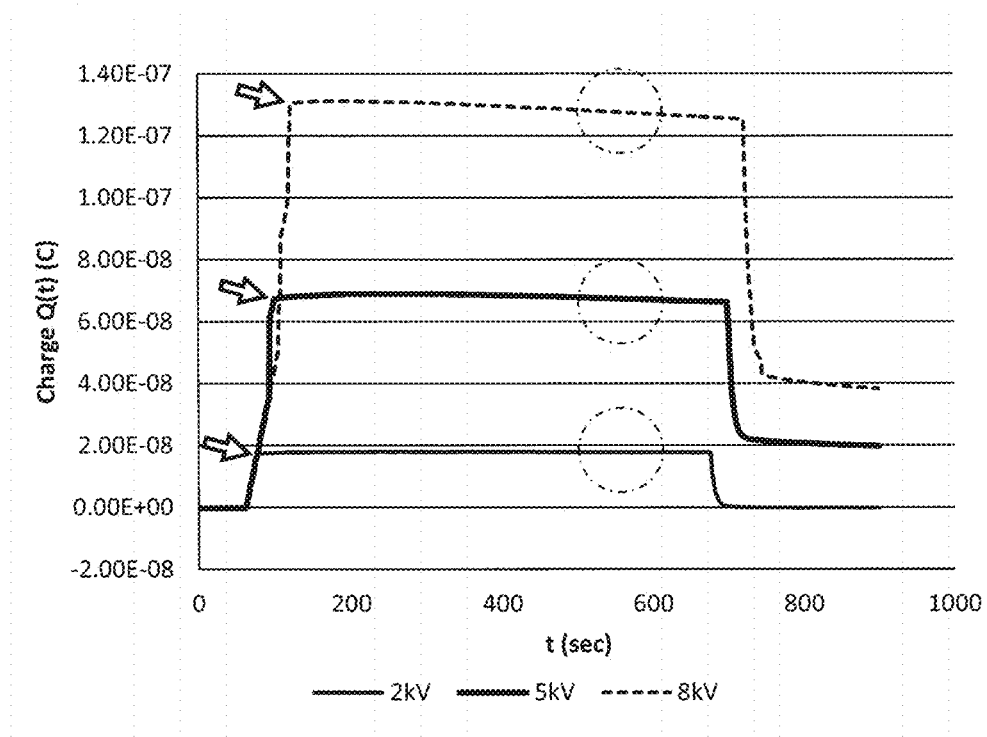
FIG. 5 is a graph of the integration value of the current measured in the state where the insulating sample is placed in the air.

In the second embodiment, current integrator 1 in FIG. 1 was used to measure integration value Q of the current in the state where insulator 9 impregnated with insulating oil (polybutene) was disposed in the air. The result is shown in FIG. 5. The applying condition of a DC voltage is the same as that in the first embodiment.

As shown in the graph in FIG. 5, integration value Q of the current increased during a time period from the start of application of a DC voltage after an elapse of 60 seconds after the start of measurement until a certain time (particularly, during voltage rising), then, integration value Q remained almost at the same level after the certain time (see the portion surrounded by an alternate long and short dash line). The portion in which integration value Q suddenly increases corresponds to a portion related to a charge current. It is considered that the partial discharge current caused by partial discharge is reflected in this portion in the case of measurement in the air.

Figure 6:
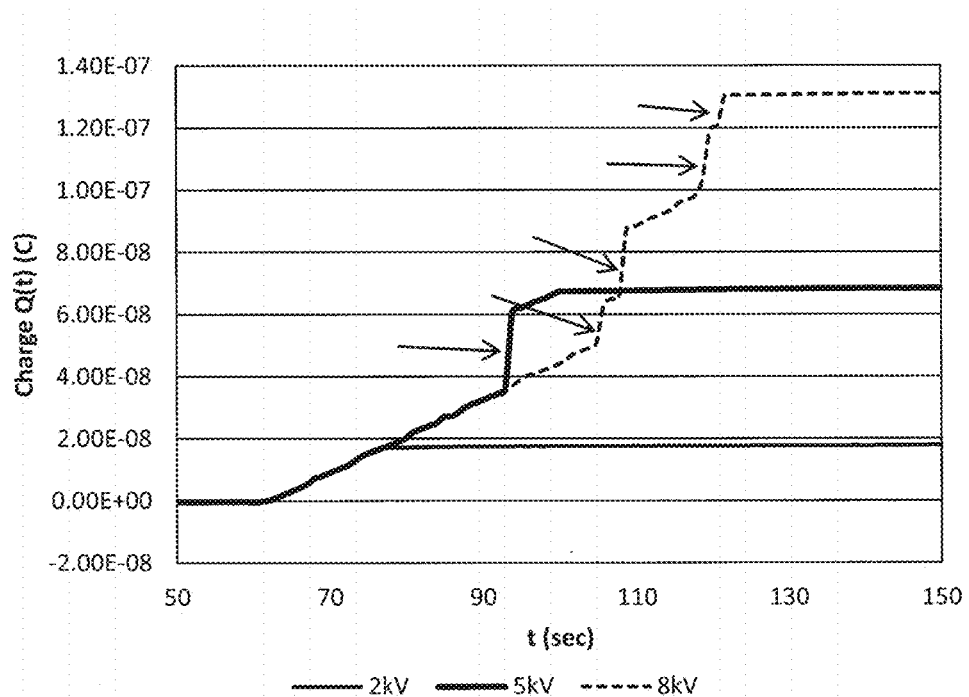
FIG. 6 is a partially enlarged view of the graph in FIG. 5.

In the second embodiment, integration value Q of the current is measured in the state where insulator 9 is disposed in the air. Accordingly, the partial discharge current is more likely to be reflected in integration value Q. FIG. 6 shows a change in integration value Q from 50 seconds to 150 seconds in the first graph in FIG. 5. As shown by an arrow in FIG. 6, in the time zone in which the influence of the charge current is dominant, there is a sudden increase in integration value Q that is different from the amount of increase in the charge current. This sudden increase of integration value Q is caused by the partial discharge current. In order to specify that such a sudden increase of integration value Q is caused by partial discharge, it is preferable to simultaneously measure partial discharge. In this case, high frequency current transformer 8 shown in FIG. 1 was used. By analyzing the frequency and the rate of such a sudden increase of integration value Q, the amount and the magnitude of the discharge gap inside insulator 9 can be estimated. Furthermore by comparing the first graph on the "A" day and the second graph on the "B" day, the state of generation of the discharge gap in insulator 9 can be evaluated.

Third Embodiment

Figure 7:
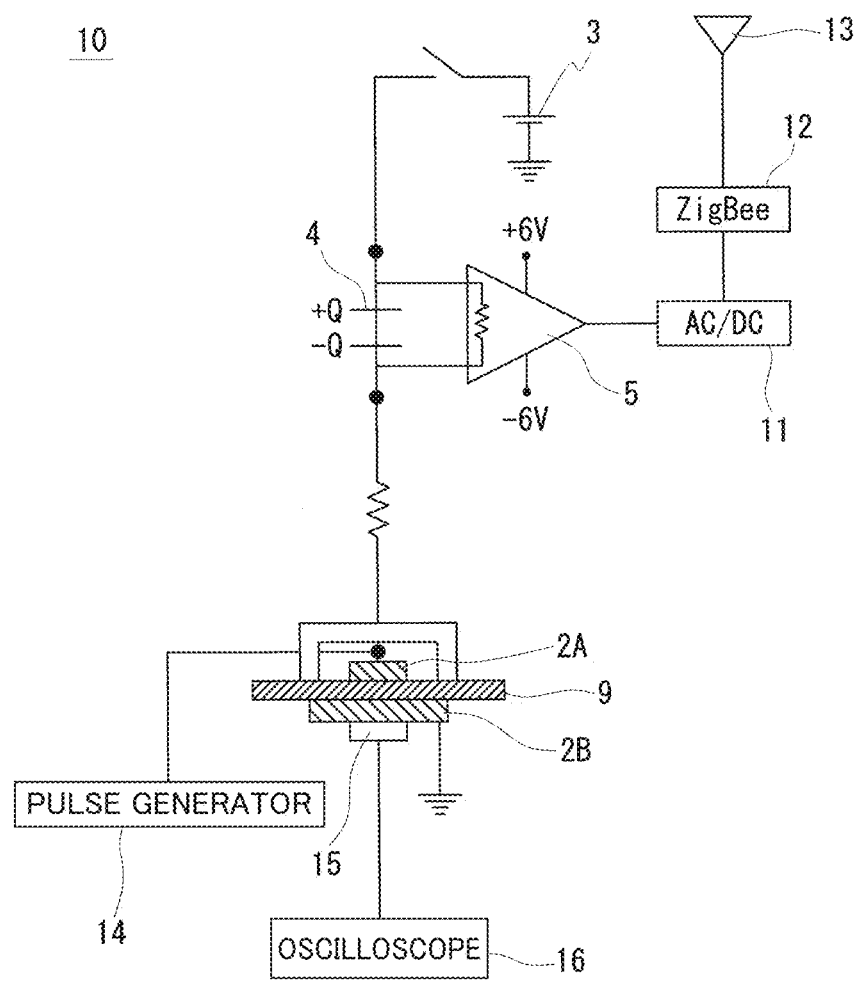
FIG. 7 is a schematic circuit diagram of a current integrator provided together with a space charge measurement apparatus.

In the third embodiment, a current integrator 10 having a space charge measurement apparatus provided together therewith will be hereinafter described with reference to FIG. 7. The same configurations in FIG. 7 as those in FIG. 1 will be designated by the same reference characters, and the description thereof will not be repeated.

In this current integrator 10, capacitor 4 and amplifier 5 for measuring integration value Q of the current are arranged on the high voltage side of insulator 9 (on the upstream side of electrode 2A connected to DC power supply 3). This arrangement is made for preventing the influence of the pulse voltage of a pulse generator 14 (described later) from being exerted upon the above-described integration value Q. In current integrator 10 in the present example, an AC/DC converter 11, a short-range wireless communication unit 12 based on ZigBee standard, an antenna 13 are connected to an amplifier 5, so as to allow wireless transmission of the measurement results of integration value Q.

In current integrator 10 in the present example, a space charge measurement apparatus is provided on the downstream side of capacitor 4 and amplifier 5. The space charge measurement apparatus has a known configuration (for example, JEC-TR-61004, "Calibration for Space Charge Distribution Measurement using Pulsed Electro-Acoustic Method"); IEC Technical Specification "Calibration of Space Charge Measuring Equipment based on Pulsed Electro-Acoustic Measurement Principle", IEC TS 62758, 18 Sep. 2012). The space charge measurement apparatus includes a pulse generator 14 configured to apply a pulse voltage to insulator 9, a piezoelectric element 15 configured to sense vibrations caused by movement of electric charge inside insulator 9, and an oscilloscope 16 configured to monitor the measurement result by piezoelectric element 15.

The space charge measurement apparatus is configured to recognize generation and movement of the space charge in insulator 9, that is, to recognize uneven distribution of space charge in insulator 9. When there is an uneven distribution, it should be regarded that a certain local change of insulation performance occurs in insulator 9. Space charge leads to generation of the space charge accumulation current in insulator 9. Accordingly, it is considered that the change in insulation performance of insulator 9 can be more specifically evaluated by measuring the space charge together with the result of integration value Q of the current.

Fourth Embodiment

In the fourth embodiment, current integrator 1 shown in FIG. 1 was used to evaluate the insulation performance of each of three insulating materials during application of a DC voltage.

<<Low Density Polyethylene>>

The first insulating material is low density polyethylene (LDPE). Insulator 9 made of LDPE had a thickness of about 0.2 mm, electrode 2A had a diameter of 73 mm, and electrode 2B had a diameter of 54 mm. At a room temperature in the measurement environment, oil was not applied onto the interface between insulator 9 and each of electrodes 2A and 2B.

Figure 8:
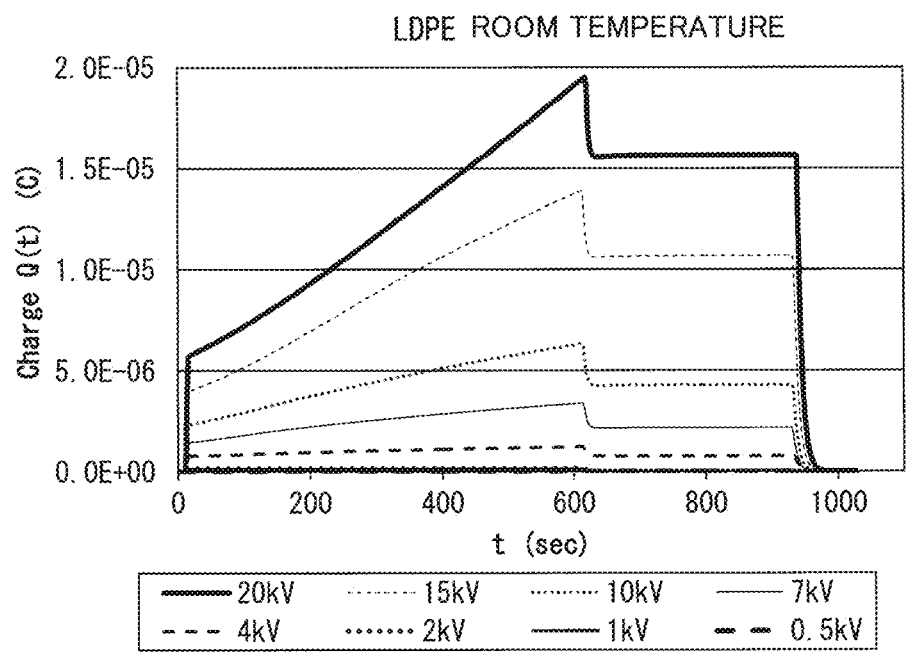
FIG. 8 is a graph of the integration value of the current in low density polyethylene at a room temperature.

The eight applying conditions were set in which final attained voltages were different, as follows. The conditions other than the final attained voltage were the same and set as follows: voltage rising rate; 133 V/sec, applying time period; 600 seconds after reaching the final attained voltage, and the holding time period after stopping voltage application; 300 seconds. FIG. 8 shows a graph obtained by plotting integration value Q of the current on each of the applying conditions. The horizontal axis shows time t (sec) and the vertical axis shows integration value Q of the current (coulomb).

(1) 0.5 kV (extra-thick dashed line)
(2) 1 kV (bold solid line)
(3) 2 kV (bold dotted line)
(4) 4 kV (bold dashed line)
(5) 7 kV (thin solid line)
(6) 10 kV (thin dotted line)
(7) 15 kV (thin dashed line)
(8) 20 kV (extra-thick solid line)

Figure 9:
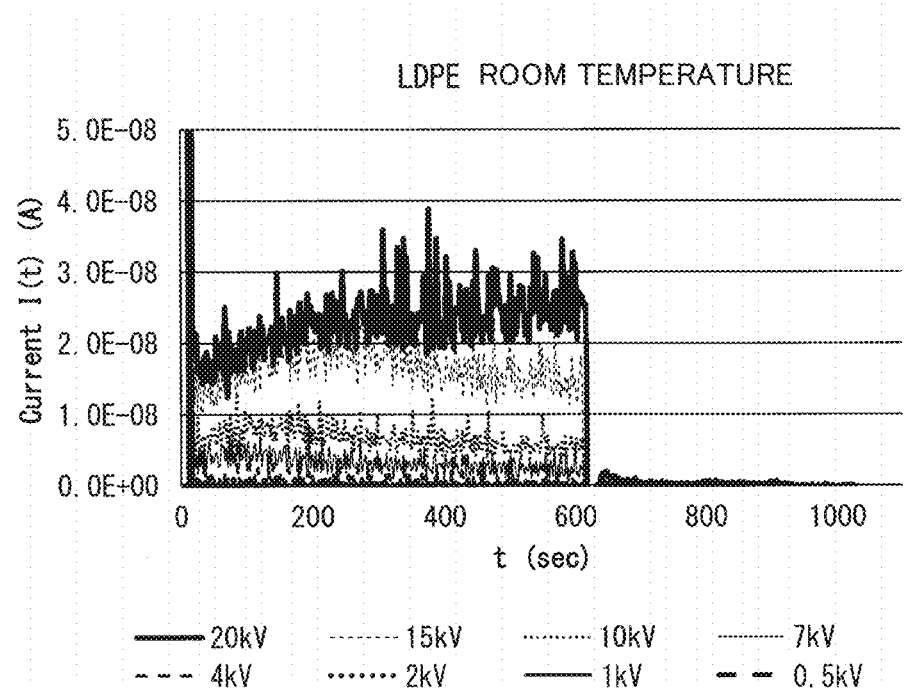
FIG. 9 is a graph of the current value in low density polyethylene at a room temperature.

In this case, as having already been described in the first embodiment, the value of the current flowing through insulator 9 is extremely weak, so that it is difficult to directly measure a current value I. However, by differentiating integration value Q of the current with respect to the time, that is, by obtaining the inclination of the graph of integration value Q of the current at a specific time, current value I of the current flowing through insulator 9 at the specific time can be obtained. Thus, integration value Q of the current was differentiated to obtain the relation between time t and current value I. The result thereof is shown in the graph in FIG. 9. In FIG. 9, the horizontal axis shows time t (sec) and the vertical axis shows current value I (ampere).

Figure 10:
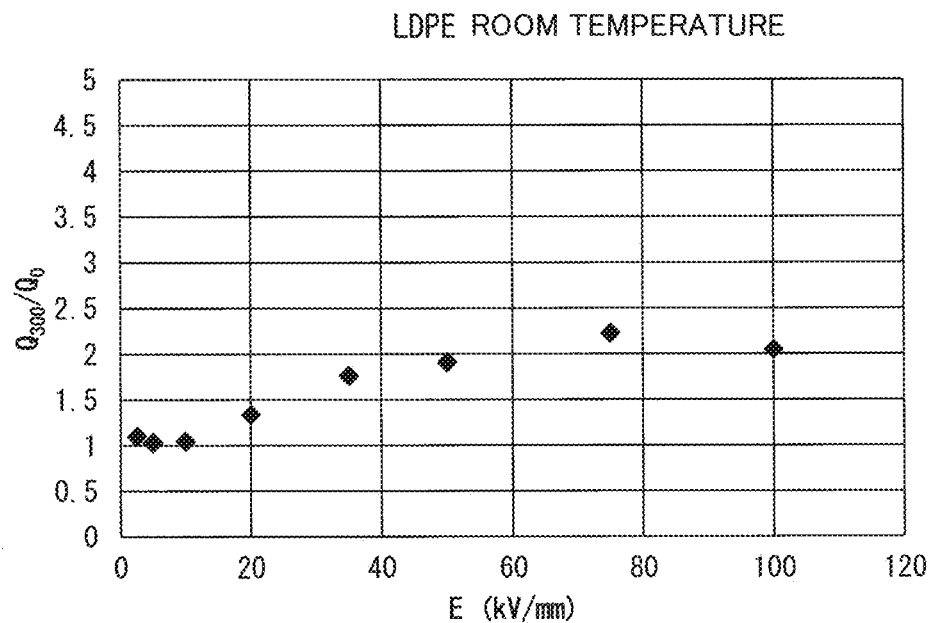
FIG. 10 is a graph of $Q_{300}/Q_0$ of low density polyethylene at a room temperature.

Furthermore, from the result of integration value Q of the current, $Q_{300}/Q_0$ was calculated as in the first embodiment. As having already been described, $Q_{300}/Q_0$ serves as an indicator for estimating the degree of accumulation of space charge in insulator 9. FIG. 10 shows a graph in which the horizontal axis shows an electric field E (kV/mm) and the vertical axis shows the value of $Q_{300}/Q_0$. In this case, electric field E is obtained by dividing the applied voltage by the thickness of insulator 9. Thus, for example, when the applied voltage is 20 kV, the thickness of insulator 9 is about 0.2 mm, so that the electric field becomes 100 kV/mm.

<<High Density Polyethylene>>

Figure 11:
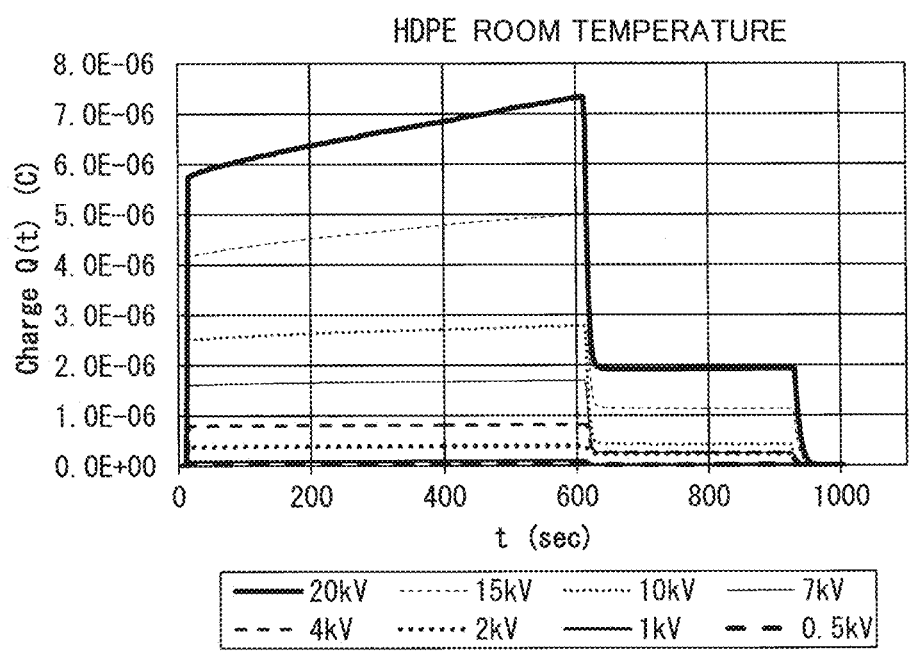
FIG. 11 is a graph of the integration value of the current in high density polyethylene at a room temperature.
Figure 12:
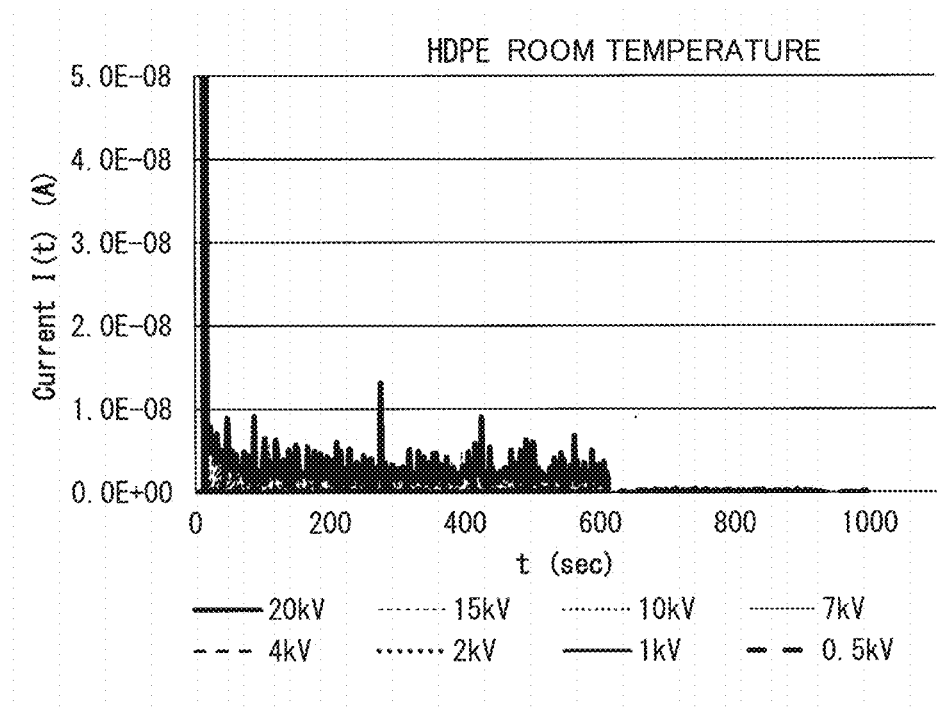
FIG. 12 is a graph of the current value in high density polyethylene at a room temperature.
Figure 13:
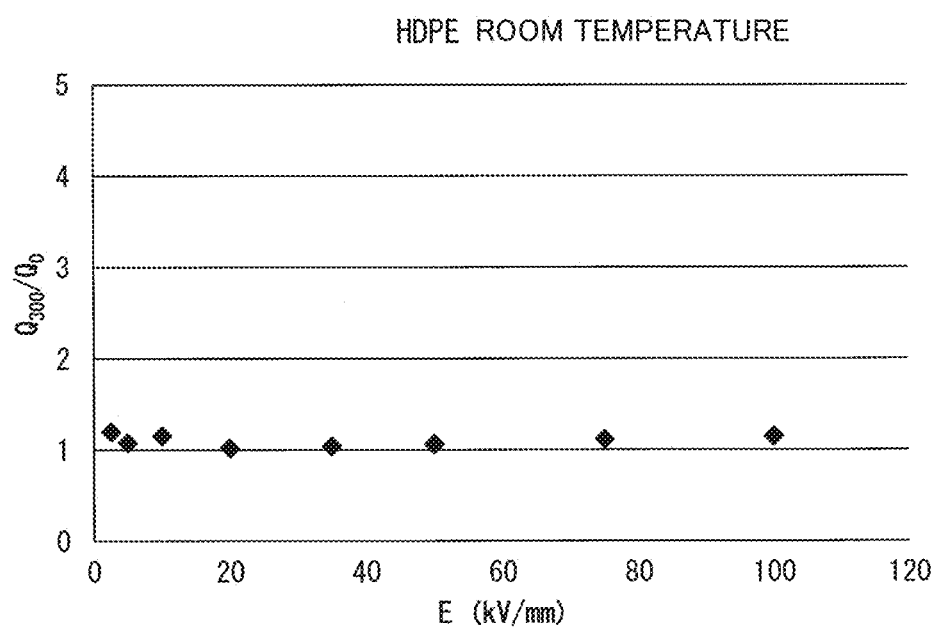
FIG. 13 is a graph of $Q_{300}/Q_0$ in high density polyethylene at a room temperature.

The second insulating material is high density polyethylene (HDPE). As to insulator 9 made of HDPE, integration value Q of the current, current value I and $Q_{300}/Q_0$ were calculated in the same manner as in the case of insulator 9 made of LDPE. FIG. 11 shows the result of integration value Q of the current, FIG. 12 shows the result of current I, and FIG. 13 shows the result of $Q_{300}/Q_0$.

<<Polystyrene>>

Figure 14:
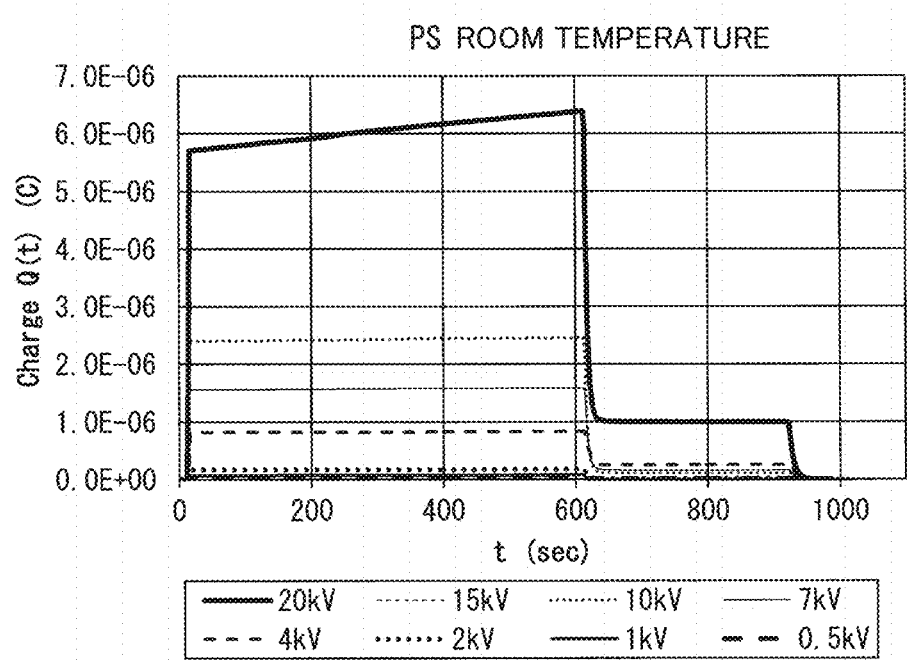
FIG. 14 is a graph of the integration value of the current in polystyrene at a room temperature.
Figure 15:
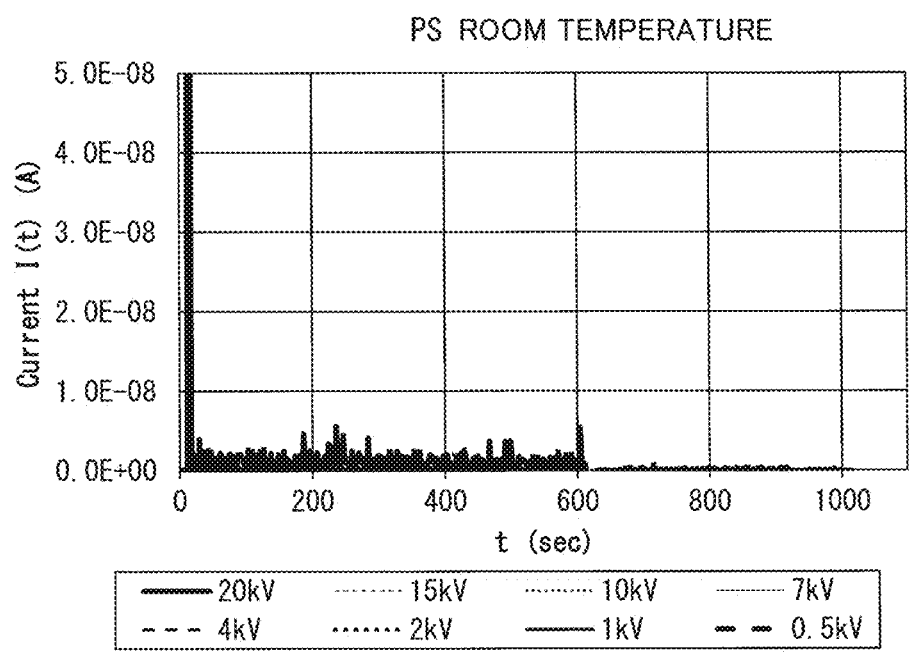
FIG. 15 is a graph of the current value in polystyrene at a room temperature.

The third insulating material is polystyrene (PS). As to insulator 9 made of PS, integration value Q of the current, current value I and $Q_{300}/Q_0$ were calculated in the same manner as in the case of insulator 9 made of LDPE. FIG. 14 shows the result of integration value Q of the current, FIG. 15 shows the result of current value I, and FIG. 16 shows the result of $Q_{300}/Q_0$.

<<Evaluations>>

By comparing FIGS. 8, 11, and 14 related to integration value Q of the current, there is not a significant difference in the amount of accumulation of electric charge in each material (integration value Q of the current) when the final attained voltage is so low as about 2 kV or less. However, it turned out that, as the applied voltage is higher, the amount of accumulation of electric charge in LDPE is significantly greater than that in HDPE and PS. Particularly, in the time period from approximately 10 seconds after the start of measurement until approximately 600 seconds in which the space charge accumulation current and the leakage current are dominant, the amount of accumulation of electric charge in LDPE increases to $10^{-5}$ level, whereas the amount of accumulation of electric charge in each of HDPE and PS remains at $10^{-6}$ level.

Figure 16:
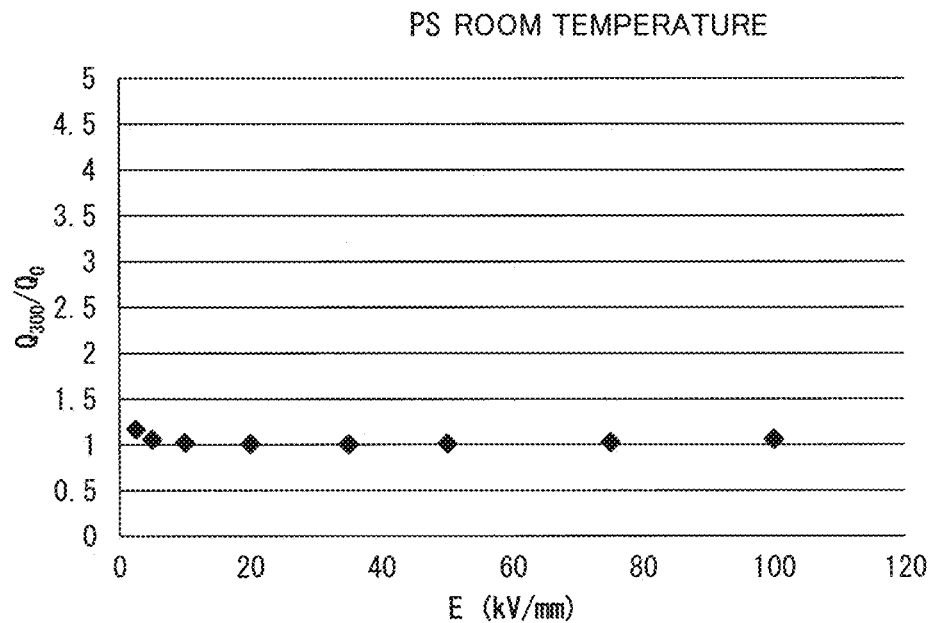
FIG. 16 is a graph of $Q_{300}/Q_0$ in polystyrene at a room temperature.

Furthermore, when comparing FIGS. 10, 13, and 16 related to $Q_{300}/Q_0$, $Q_{300}/Q_0$ of each of HDPE (FIG. 13) and PS (FIG. 16) is stabilized at around 1.0, whereas $Q_{300}/Q_0$ of LDPE (FIG. 10) increases in accordance with an increase in electric field E. Particularly, as shown in FIG. 10, when electric field E exceeds 35 kV/mm (applied voltage of 7 kV), $Q_{300}/Q_0$ of LDPE exceeds 1.5. Thus, it turned out that the leakage current of LDPE remarkably increases. The increased leakage current means that the electric conductivity of LDPE has increased. In view of the above results, it is presumed that, when the applied voltage is raised (for example, 5 kV or more), HDPE and PS are more preferable as an insulator than LDPE.

Then, by comparing FIGS. 9, 12, and 15 related to current value I, the variations in the current during accumulation of electric charge can be recognized. As to LDPE, it turns out from FIG. 9 that not only a large current flows through LDPE, but also there is a significant change in current over time. Also, by comparing FIGS. 12 and 15, there is almost no difference in current value I and also in temporal change of the current between HDPE (FIG. 12) and PS (FIG. 15).

Fifth Embodiment

In the fifth embodiment, integration values Q of three insulating materials in the fourth embodiment were measured at a measurement temperature different from that in the fourth embodiment, to obtain the measurement results, which were then compared with the measurement results in the fourth embodiment.

Integration value Q of the current, current value I, and $Q_{300}/Q_0$ were obtained in the same manner as in the fourth embodiment except for the measurement temperature set at 80° C.

Figure 17:
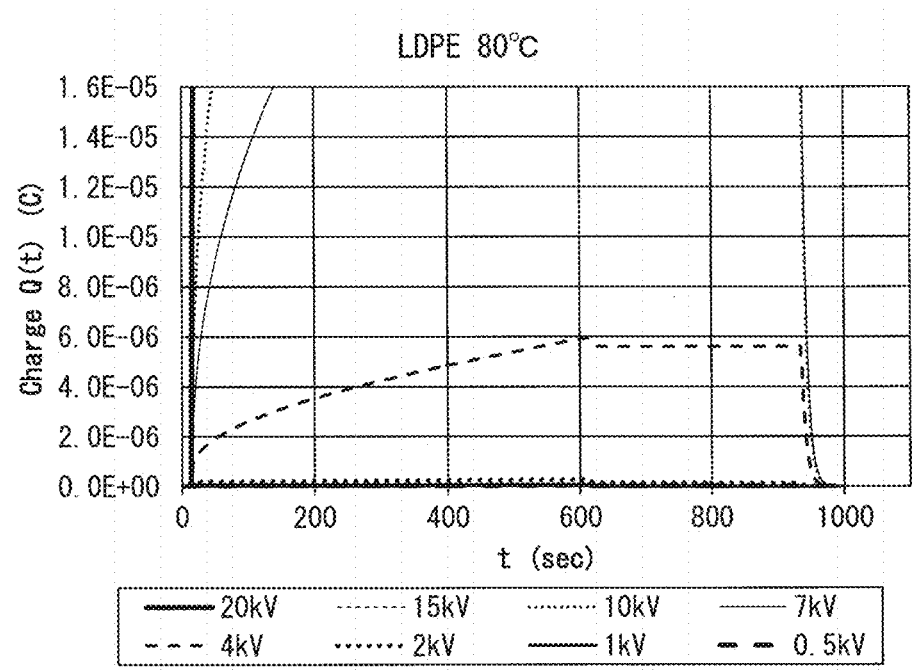
FIG. 17 is a graph of the integration value of the current in low density polyethylene at 80° C.
Figure 18:
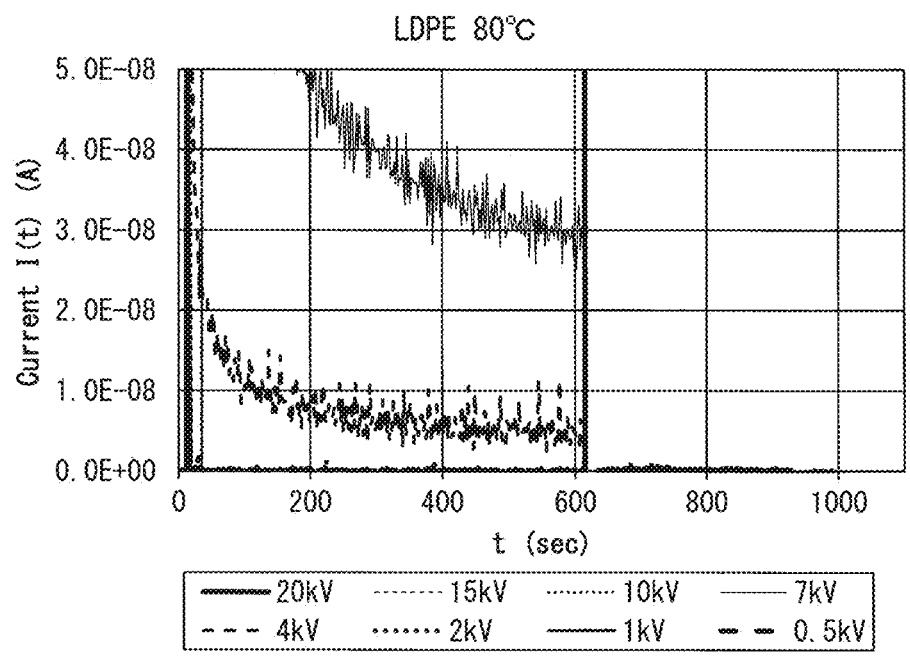
FIG. 18 is a graph of the current value in low density polyethylene at 80° C.
Figure 19:
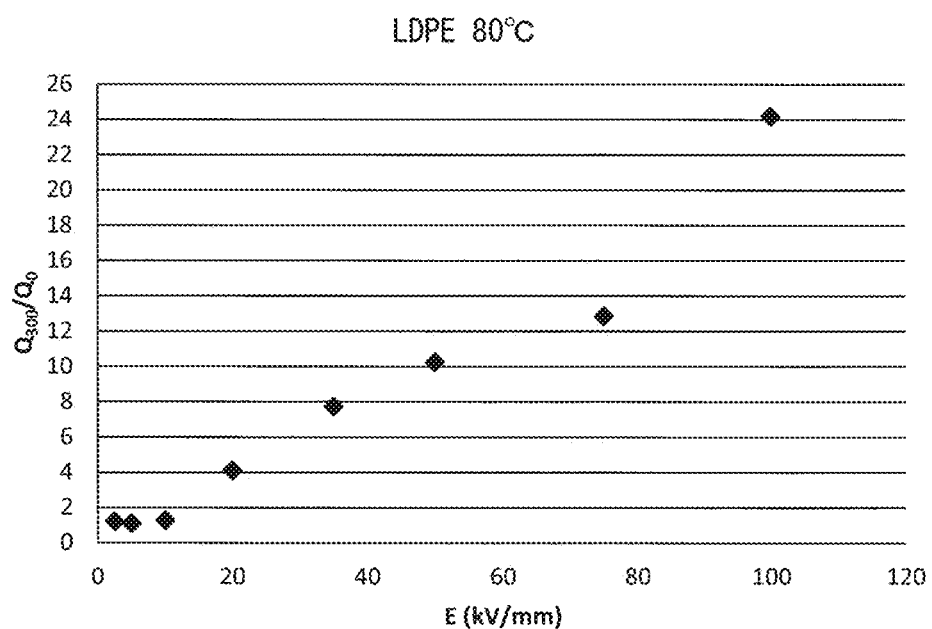
FIG. 19 is a graph of $Q_{300}/Q_0$ in low density polyethylene at 80° C.

FIGS. 17, 18, and 19 show integration value Q, current value I and $Q_{300}/Q_0$, respectively, about LDPE.

Figure 20:
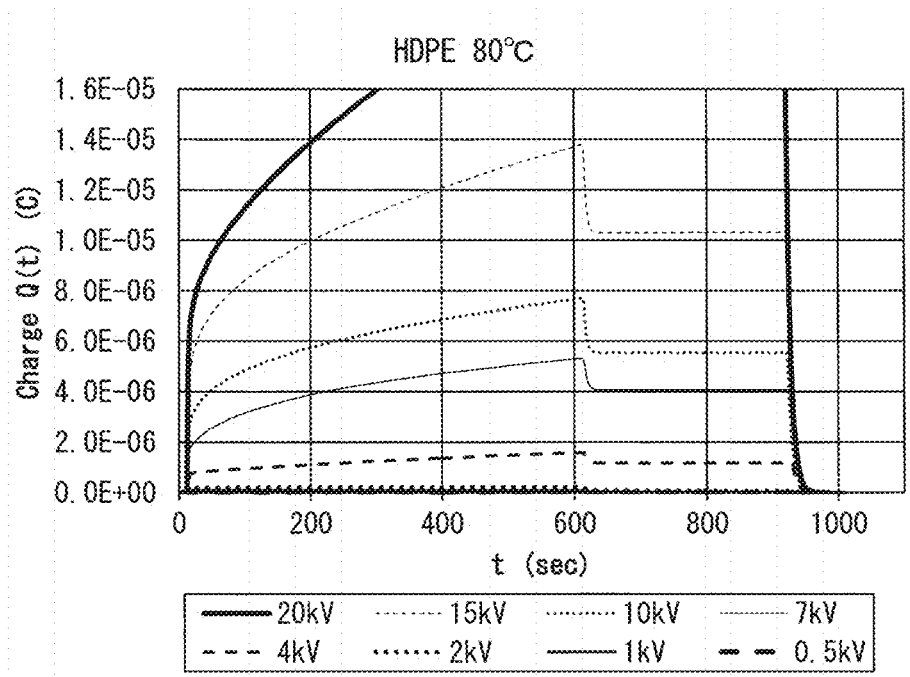
FIG. 20 is a graph of the integration value of the current in high density polyethylene at 80° C.
Figure 21:
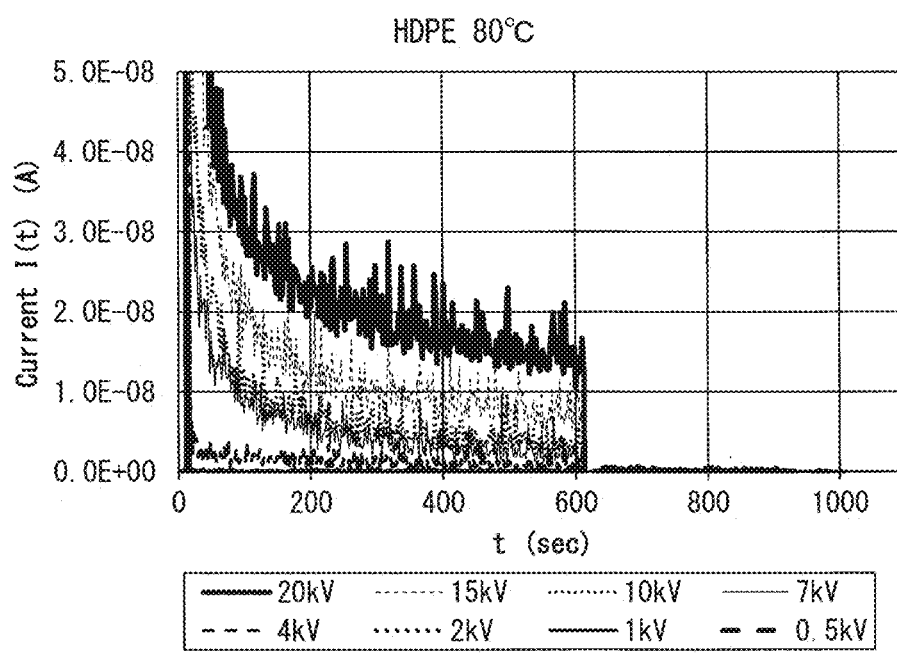
FIG. 21 is a graph of the current value in high density polyethylene at 80° C.
Figure 22:
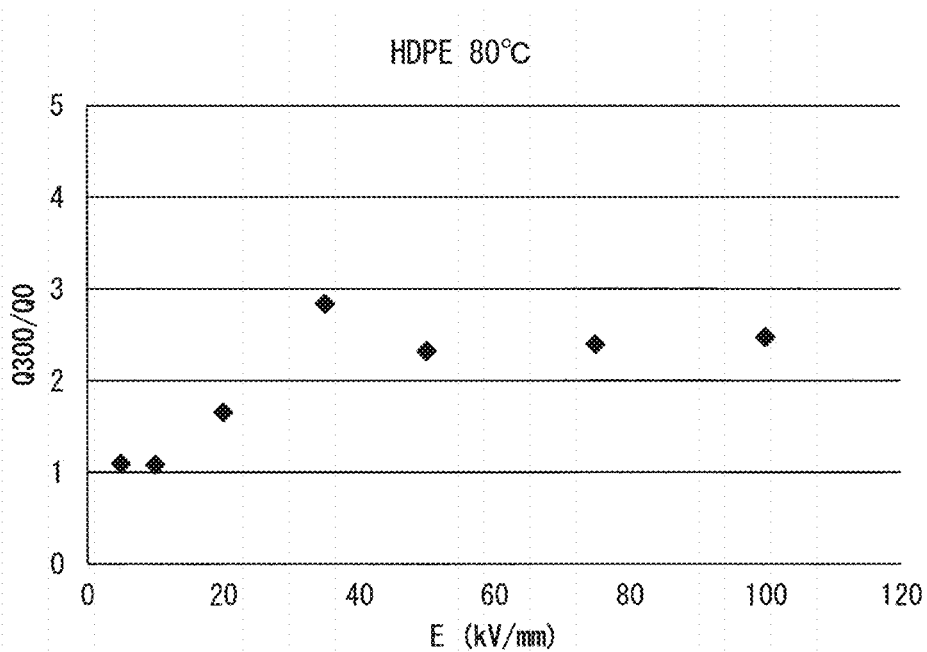
FIG. 22 is a graph of $Q_{300}/Q_0$ in high density polyethylene at 80° C.

FIGS. 20, 21, and 22 show integration value Q, current value I and $Q_{300}/Q_0$, respectively, about HDPE.

Figure 23:
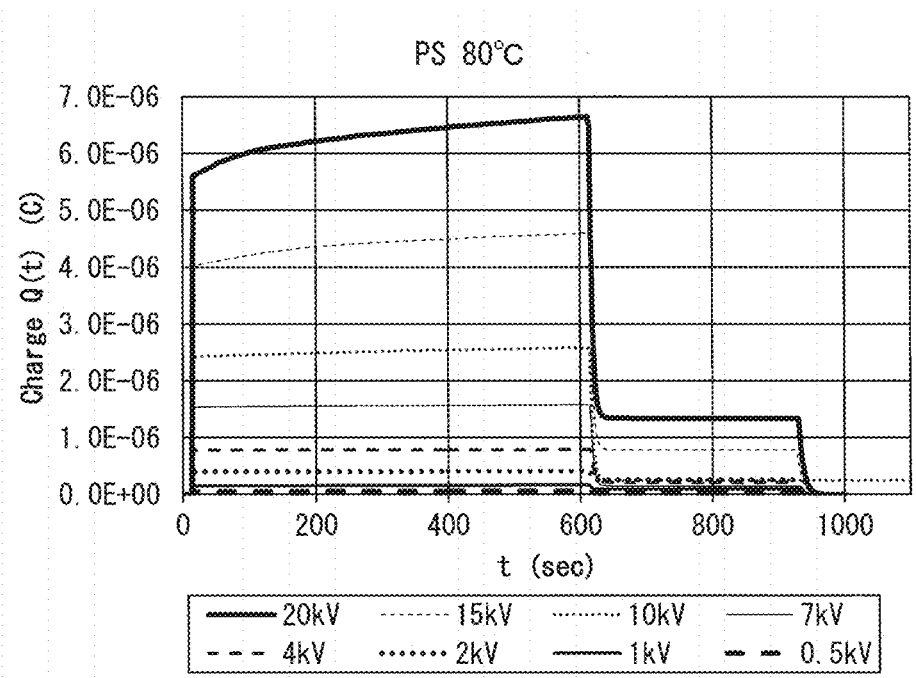
FIG. 23 is a graph of the integration value of the current in polystyrene at 80° C.
Figure 24:
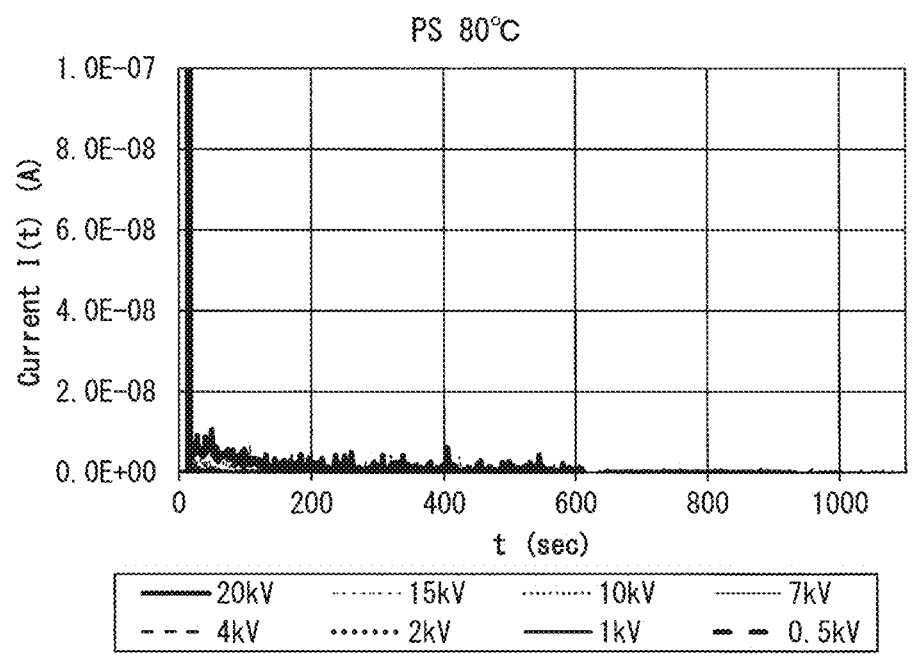
FIG. 24 is a graph of the current value in polystyrene at 80° C.
Figure 25:
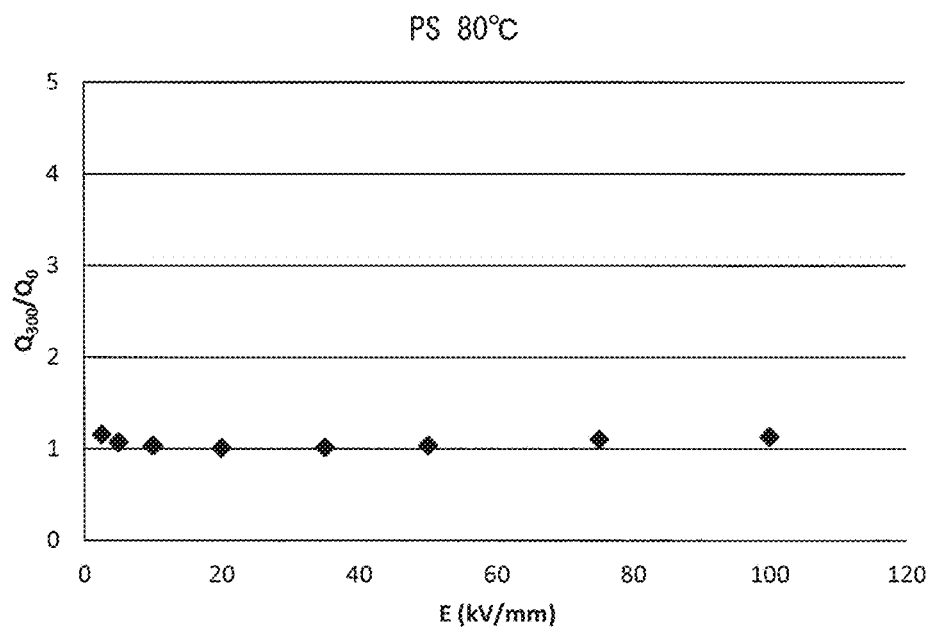
FIG. 25 is a graph of $Q_{300}/Q_0$ in polystyrene at 80° C.

FIGS. 23, 24, and 25 show integration value Q, current value I and $Q_{300}/Q_0$, respectively, about PS.

By comparison between FIG. 8 (FIG. 10) and FIG. 17 (FIG. 19) related to LDPE, comparison between FIG. 11 (FIG. 13) and FIG. 20 (FIG. 22) related to HDPE, and comparison between FIG. 14 (FIG. 16) and FIG. 23 (FIG. 25) related to PS, it turned out that PS (FIGS. 23 and 25) exhibits excellent insulation performance also in a high temperature environment of 80° C.

Furthermore, by comparing FIGS. 18, 21 and 24 related to current value I, it turned out that, in a high temperature environment of 80° C., current value I and its change are relatively large in the case of LDPE (FIG. 18) and HDPE (FIG. 21), but relatively small in the case of PS (FIG. 24).

<Uses>

The evaluation method for insulation performance of an insulator according to the embodiment can be suitably utilized for evaluating the temporal change in insulation performance of an insulator. In the future, it is expected that the evaluation method for insulation performance of an insulator according to the embodiment can be utilized for: deterioration diagnosis of an insulating layer of a power cable for DC power transmission, for example, a superconductive cable; deterioration diagnosis of an insulating layer (an insulator) of an oil-impregnated insulation cable; and deterioration diagnosis of a solid insulator of a solid insulation cable. Furthermore, it is expected that the evaluation method can be utilized also for deterioration diagnosis of an insulator included in an electrical device other than a power cable, for example, such as a capacitor, a battery and the like that are used with a DC voltage applied thereto. Furthermore, even in the case of an electrical device used at an alternating current, but as long as the state change of the insulator provided in the electrical device, for example, water tree deterioration, deterioration of the insulator caused by high temperature or exposure to radiation, and the like are captured by the monitoring method of the present invention, it is considered that there may be a way to utilize the monitoring method of the present invention as a method of tracking the state change in the insulator at an alternating current.

REFERENCE SIGNS LIST

1, 10 current integrator, 2A, 2B electrode, 3 DC power supply, 4 capacitor, 5 amplifier, 6 voltmeter, 7 relay, 8 high frequency current transformer, 9 insulator, 11 AC/DC converter, 12 short-range wireless communication unit, 13 antenna, 14 pulse generator, 15 piezoelectric element, 16 oscilloscope.

The invention claimed is:

1. An evaluation method for insulation performance of an insulator, the evaluation method comprising:
    a step α of applying a DC voltage to a first insulator on a prescribed applying condition, and measuring a first integration value of a current flowing through the first insulator from a start of application of the DC voltage until an elapse of a prescribed time period after an end of application of the DC voltage;
    a step β of applying the DC voltage to a second insulator on an applying condition that is identical to the applying condition in the step α, and measuring a second integration value of a current flowing through the second insulator from a start of application of the DC voltage until an elapse of the prescribed time period after an end of application of the DC voltage; and
    a step γ of comparing (i) a first graph showing a first relation between the elapsed time period and the first integration value that are obtained in the step α and (ii) a second graph showing a second relation between the elapsed time period and the second integration value that are obtained in the step β, to evaluate a difference between insulation performance of the first insulator and insulation performance of the second insulator due to application of the DC voltage,
    each of first and second integration values being obtained by a current integrator including
        a capacitor connected in series to a corresponding one of the first insulator and the second insulator, and
        a voltmeter configured to measure a voltage applied to the capacitor,
    the current integrator being configured to measure each of the first and second integration values based on a measurement result of the voltmeter,
    the applying condition including
        a voltage raising operation for raising a voltage from 0 kV to a prescribed final attained voltage,
        a voltage holding operation for holding the final attained voltage for a fixed time period,
        a discharge operation for discharging the capacitor while stopping application of the voltage, and
        a grounding operation for grounding the capacitor.

2. The evaluation method for insulation performance of an insulator according to claim 1, wherein
    the second insulator is provided as the first insulator that is changed in insulation performance, and
    the step α and the step β are identical in measurement environment condition.

3. The evaluation method for insulation performance of an insulator according to claim 1, wherein
    the second insulator is made of a material different from a material of the first insulator, and
    the step α and the step β are identical in measurement environment condition.

4. The evaluation method for insulation performance of an insulator according to claim 1, wherein
    the second insulator is made of a material identical to a material of the first insulator, and
    the step α and the step β are different in measurement environment condition.

5. The evaluation method for insulation performance of an insulator according to claim 1, comprising:
    a step δ of applying the DC voltage to the first insulator on an applying condition that is different only in the final attained voltage from the applying condition in the step α, and measuring a third integration value of a current that flows through the first insulator from a start of application of the DC voltage until an elapse of the prescribed time period after an end of application of the DC voltage; and
    a step ε of applying the DC voltage to the second insulator on an applying condition that is identical to the applying condition in the step δ, and measuring a fourth integration value of a current that flows through the second insulator from a start of application of the DC voltage until an elapse of the prescribed time period after an end of application of the DC voltage, wherein
the step γ includes evaluating the difference between the insulation performance of the first insulator and the insulation performance of the second insulator, together with a measurement result in the step δ and a measurement result in the step ε.

6. The evaluation method for insulation performance of an insulator according to claim 1, wherein
each insulation performance is a relative dielectric constant of a corresponding one of the first insulator and the second insulator, and
the relative dielectric constant corresponds to a portion that exists in the first graph or the second graph and that is related to a charge current accumulated in each of the first insulator and the second insulator, and
the relative dielectric constant is calculated from each of the integration values obtained in the portion from the start of application of the DC voltage until the elapse of the prescribed time period.

7. The evaluation method for insulation performance of an insulator according to claim 1, wherein
each insulation performance is an electric conductivity of a corresponding one of the first insulator and the second insulator,
the electric conductivity corresponds to a portion that exists in the first graph or the second graph and that is related to a leakage current flowing through each of the first insulator and the second insulator, and
the electric conductivity is calculated from an inclination of each of the integration values obtained after the elapse of the prescribed time period since the start of application of the DC voltage.

8. The evaluation method for insulation performance of an insulator according to claim 1, wherein
each insulation performance is a state of existence of a discharge gap inside a corresponding one of the first insulator and the second insulator, and
the state of existence of the discharge gap is obtained by specifying a portion that exists in the first graph or the second graph and that is related to a partial discharge current flowing through each of the first insulator and the second insulator.

9. The evaluation method for insulation performance of an insulator according to claim 8, wherein
each of the step α and the step β includes sensing a timing of occurrence of partial discharge by a sensor configured to sense a high frequency pulse generated during partial discharge, to specify the partial discharge current in each of the first graph and the second graph.

10. The evaluation method for insulation performance of an insulator according to claim 1, wherein
each insulation performance is an accumulation behavior of space charge in a corresponding one of the first insulator and the second insulator,
an influence of the accumulation behavior of the space charge is calculated by comparing $Q_A/Q_0$ in the first graph or the second graph,
$Q_0$ is the first or second integration value at time $T_0$ at which a charge current accumulated in each of the first insulator and the second insulator after the elapse of the prescribed time period from the start of application of the DC voltage decreases to a negligible level, and
$Q_A$ is the first or second integration value at time $T_A$ after an elapse of another prescribed time period since the time $T_0$.

11. The evaluation method for insulation performance of an insulator according to claim 10, wherein
each of the step α and the step β includes sensing the accumulation behavior of the space charge by a pulsed electro-acoustic (PEA) method, to specify the accumulation behavior of the space charge in each of the first graph and the second graph.

12. The evaluation method for insulation performance of an insulator according to claim 1, wherein the current integrator is disposed on a ground side of each of the first insulator and the second insulator to measure a corresponding one of the integration values.

13. The evaluation method for insulation performance of an insulator according to claim 1, wherein the current integrator is disposed on a high voltage side of each of the first insulator and the second insulator to measure a corresponding one of the integration values.

* * * * *